US006660453B2

(12) United States Patent
Hirano et al.

(10) Patent No.: US 6,660,453 B2
(45) Date of Patent: Dec. 9, 2003

(54) WATERLESS PLANOGRAPHIC PRINTING PLATE PRECURSOR AND PRODUCTION METHOD THEREOF

(75) Inventors: Tsumoru Hirano, Shizuoka-ken (JP); Koji Sonokawa, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 249 days.

(21) Appl. No.: 09/747,964

(22) Filed: Dec. 27, 2000

(65) Prior Publication Data

US 2001/0026902 A1 Oct. 4, 2001

(30) Foreign Application Priority Data

Dec. 28, 1999 (JP) .......................................... 11-373622

(51) Int. Cl.$^{7}$ .......................... G03F 7/004; G03F 7/035

(52) U.S. Cl. .................... 430/272.1; 430/303; 430/944; 430/945

(58) Field of Search ................................ 430/303, 944, 430/945, 272.1

(56) References Cited

U.S. PATENT DOCUMENTS

| | | | | | |
|---|---|---|---|---|---|
| 5,069,992 | A | * | 12/1991 | Tachikawa et al. | 430/49 |
| 5,290,663 | A | * | 3/1994 | Huynh-Tran | 430/284 |
| 5,786,125 | A | * | 7/1998 | Tsuchiya et al. | 430/272.1 |
| 5,849,464 | A | * | 12/1998 | Yokoya et al. | 430/303 |
| 5,866,294 | A | * | 2/1999 | Ognui et al. | 430/166 |
| 5,919,600 | A | * | 7/1999 | Huang et al. | 430/272.1 |
| 6,074,797 | A | * | 6/2000 | Suezawa et al. | 430/166 |
| 6,218,073 | B1 | * | 4/2001 | Shimizu et al. | 430/273.1 |
| 6,228,559 | B1 | * | 5/2001 | Oda | 430/272.1 |
| 6,284,433 | B1 | * | 9/2001 | Ichikawa et al. | 430/303 |
| 6,340,551 | B1 | * | 1/2002 | Miyake et al. | 430/192 |
| 6,344,306 | B1 | * | 2/2002 | Fujiyoshi et al. | 430/272.1 |
| 6,475,700 | B1 | * | 11/2002 | Higashi et al. | 430/278.1 |
| 2002/0136987 | A1 | * | 9/2002 | Oshima | 430/281.1 |
| 2002/0146634 | A1 | * | 10/2002 | Hong et al. | 430/166 |

FOREIGN PATENT DOCUMENTS

| | | |
|---|---|---|
| EP | 0 386 777 A2 | 9/1990 |
| EP | 0 794 055 A2 | 9/1997 |
| EP | 0 938 028 A1 | 8/1999 |

* cited by examiner

*Primary Examiner*—Janet Baxter
*Assistant Examiner*—Amanda C. Walke
(74) *Attorney, Agent, or Firm*—Burns, Doane, Swecker & Mathis, LLP

(57) ABSTRACT

A waterless planographic printing plate precursor which has a support member, a light-to-heat conversion layer for converting laser light to heat, and a silicone rubber layer. The light-to-heat conversion layer is contains at least one kind of polyurethane having at least one carboxyl group, and at least one light-to-heat conversion substance.

21 Claims, No Drawings

WATERLESS PLANOGRAPHIC PRINTING PLATE PRECURSOR AND PRODUCTION METHOD THEREOF

BACKGROUND OF THE INVENTION

1. Field of the Invention

The present invention relates to a waterless planographic printing plate precursor (hereinafter, referred to as a waterless plate precursor) which enables a printing, without the need for dampening water, by means of a heat mode recording process using laser light. More specifically the present invention relates to a waterless plate precursor, which does not generate toxic gas at the time of image formation as well as printing plate preparation.

2. Description of the Related Art

In a conventional printing system using a planographic printing plate precursor which requires dampening water, it is difficult to control the fine balance between dampening water and ink. For this reason, there have been serious problems such as the ink being emulsified or the ink being mixed into dampening water, causing insufficient ink densities and surface stains, and subsequent waste of paper. In contrast, a waterless plate precursor, which requires no dampening water, has many advantages. Various types of such waterless plate precursors have been proposed, for example, in Japanese Patent Application Publication (JP-B) No. 44-23042, JP-B No. 46-16044, JP-B No. 54-26923, JP-B No. 56-14976, JP-B No. 56-23150, JP-B No. 61-54222, Japanese Patent Application Laid-Open (JP-A) No. 58-215411, JP-A No. 2-16561 and JP-A No. 2-236550.

In recent years, along with the rapid development in output systems such as pre-press systems, image setters and laser printers, many methods for providing printing plates have been proposed in which a print image is converted into digital data and new plate-making methods such as a computer-to-plate method or a computer-to-cylinder method are used. Accordingly, there have been increasing demands for new types of printing materials for use in these printing systems, and the development thereof has progressed.

Methods for forming waterless planographic printing plate precursors by utilizing a writing process using laser light are disclosed, for example, in JP-B No. 42-21879, JP-A No. 50-158405, JP-A No. 6-55723, JP-A No. 6-186750, U.S. Pat. No. 5,353,705, and International Publication (WO) No. 9401280. In these methods, on a support member are successively formed a light-to-heat conversion layer containing a light-to-heat conversion agent such as carbon black and a self-oxidizing binder such as nitrocellulose, and a silicone rubber layer which is ink-repellant. Portions of the silicon rubber layer are removed by laser irradiation such that these portions are made to have an ink-adhering property, thereby making it possible to carry out a waterless printing process. However, the light-to-heat conversion layer contains self-oxidizing nitrogen-containing compounds such as nitrocellulose, ammonium nitride or the like as a thermal decomposing compound. For this reason, when the carbon black in the light-to-heat conversion layer absorbs laser light, generates heat and causes the light-to-heat conversion layer to be destroyed, the nitrocellulose is decomposed to generate toxic gases such as nitrogen oxides. Thus, such methods are not preferable from an environmental standpoint.

In order to overcome such environment-related problems due to thermal decomposing nitrogen-containing compounds such as nitrocellulose, JP-A No. 10-319579 has proposed a waterless printing plate which is writable by using a laser and which has a light-to-heat conversion layer containing a light-to-heat conversion agent and a hydroxyl-group-containing compound other than nitrocellulose. In this printing plate, between the light-to-heat conversion layer and the silicone rubber layer, a bond which is dissociated by heat is formed by utilizing a reactant or the like of an epoxy compound. However, this plate has the problem of insufficient sensitivity to lasers used for recording images.

SUMMARY OF THE INVENTION

The object of the present invention is to provide a waterless planographic printing plate precursor which is writable by laser and which does not generate toxic gases such as nitrogen oxides at the time of recording an image. Moreover, another object of the present invention is to provide a waterless planographic printing plate precursor which has a recording layer that exhibits high sensitivity to lasers used for writing.

The inventors of the present invention have studied how to achieve the above-mentioned object, and achieved the present invention by discovering that it is possible to achieve the above-mentioned object by using a specific polyurethane in the light-to-heat layer.

A first aspect of the present invention is a waterless planographic printing plate precursor comprising a support member, a light-to-heat conversion layer for converting laser light to heat and a silicone rubber layer. The light-to-heat conversion layer contains at least one polyurethane having at least one carboxyl group, and at least one light-to-heat conversion substance.

A second aspect of the present invention is a method of producing a waterless planographic printing plate precursor comprising the steps of providing a light-to-heat conversion layer on a support member and forming a silicone rubber layer on the light-to-heat conversion layer. The light-to-heat conversion layer includes at least one of polyurethane having at least one carboxyl group, and at least one light-to-heat conversion substance.

This light-to-heat conversion layer is preferably formed so as not to contain a self-oxidizing nitrogen-containing compound such as nitrocellulose, from the standpoint of prevention of environmental problems.

Since the planographic printing plate precursor of the present invention contains no self-oxidizing compound such as nitrocellulose in its light-to-heat conversion layer, neither violent combustion nor destruction occurs due to irradiation with laser light, and no toxic gases such as nitrogen oxides are generated. Moreover, since polyurethane, which contains at least one carboxyl group, is used in the light-to-heat conversion layer, the decomposition temperature of the light-to-heat conversion layer becomes lower. Therefore, the inventors have concluded that the adhesive strength between the silicone rubber layer and the light-to-heat conversion layer in a laser irradiation section is effectively reduced, with the result that it becomes possible to provide a waterless printing plate with high sensitivity.

DESCRIPTION OF THE PREFERRED EMBODIMENTS

The present invention will be described in detail hereinafter.

In the present invention, the light-to-heat conversion layer is placed closer to the support member than the silicone rubber layer. Namely, the waterless planographic printing plate precursor of the present invention is provided with a light-to-heat conversion layer and a silicone rubber layer that are laminated on a support member in that order. The layer structure is not particularly limited as long as these two layers are laminated in this order, that is, as long as the light-to-heat conversion layer is placed closer to the support member than the silicone rubber layer. Moreover, as long as the effects of the present invention are not impaired, an intermediate layer, an overcoat layer, a back coat layer or the like may be added thereto as needed. Here, the planographic printing plate precursor refers to the structure prior to formation of an image pattern formed by ink receiving portions and ink non-receiving portions.

Light-to-Heat Conversion Layer

The feature of the waterless planographic printing plate precursor is its light-to-heat conversion layer. In other words, the light-to-heat conversion layer contains (A) polyurethane having at least one carboxyl group and (B) a light-to-heat conversion agent as essential components, and may also contain other compounds, if necessary. First, an explanation will be given of this light-to-heat conversion layer.

(A) Polyurethane Having at Least One Carboxyl Group

The polyurethane used in the present invention is polyurethane which has a structural unit as a basic skeleton obtained by a reaction between at least one kind of diisocyanate compound (I), and a structural unit represented by at least one kind of diol compound having at least one carboxyl group (II), which will be described later. Namely, the polyurethane used in the present invention is obtained by a reaction between at least one of diisocyanate compound (I), and at least one of diol compound having at least one carboxyl group (II). The diol compound having at least one carboxyl group (II) comprises each of diol compounds represented by the following general formulas (2), (3) and (4) and a compound obtained by subjecting tetracarboxylic dianhydride to a ring-opening reaction by using a diol compound and combination thereof.

The following description will discuss respective compounds, which form the polyurethane having at least one carboxyl group in accordance with the present invention.

(I) Diisocyanate Compound

The following compounds are examples of the diisocyanate compound (I), which is applicable to the present invention.

Diisocyanate compounds represented by the following formula (1):

$$OCN—L^1—NCO \qquad \text{Formula (1)}$$

In the formula, $L^1$ represents a bivalent aliphatic or aromatic hydrocarbon group (hydrocarbon radical) that may have a substituent. If necessary, another functional group that does not react with the isocyanate group, for example, an ester, urethane, amide, or ureido group, may be contained therein.

Specific examples of the diisocyanate compound represented by the above-mentioned formula (1), are listed as follows: aromatic diisocyanate compounds such as 2,4-tolylenediisocyanate, dimers of 2,4-tolylenediisocyanate, 2,6-tolylenediisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate or the like; aliphatic diisocyanate compounds such as hexamethylene diisocyanate, trimethylhexamethylene diisocyanate, lysine diisocyanate, dimer acid diisocyanate or the like; alicyclic diisocyanate compounds such as isophorone diisocyanate, 4,4'-methylenebis(cyclohexylisocyanate), methylcyclohexane-2,4(or 2,6)diisocyanate, 1,3-(isocyanatemethyl)cyclohexane or the like; and a diisocyanate compound which is a reactant of diisocyanate and diol, such as an adduct of one mol of 1,3-butylene glycol and 2 mol of trilene diisocyanate or the like.

(II) Diol Compound Having at Least One Carboxyl Group

Examples of the diol compound (II) forming the urethane having at least one carboxyl group in the present invention are a structural unit represented by at least one type of diol compound of the following formulas (2), (3) and (4) and/or at least one type of a compound obtained by subjecting tetracarboxylic dianhydride (III) to a ring-opening reaction by using a diol compound (IV).

Formula 2

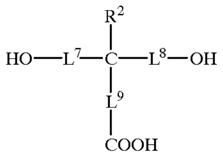

Formula 3

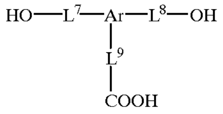

Formula 4

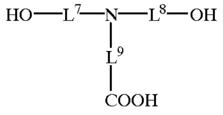

In the formulas, $R^2$represents a hydrogen atom or an alkyl, aralkyl, aryl, alkoxy, or aryloxy group which may contain a substituent (including, for example, cyano group, nitro group, halogen atoms, such as —F, —Cl, —Br and —I, and groups such as $—CONH_2$, $—COOR^3$, $—OR^3$, $—NHCONHR^3$, $—NHCOOR^3$, $—NHCOR^3$, and $—OCONHR^3$ (here, $R^3$ represents an alkyl group having 1 to 10 carbon atoms, or an aralkyl group having 7 to 15 carbon atoms)). Preferably, $R^2$represents a hydrogen atom, an alkyl group having 1 to 8 carbon atoms or an aryl group having 6 to 15 carbon atoms.

Each of $L^7$, $L^8$ and $L^9$ may be the same or different, and represents a single bond, or a bivalent aliphatic or aromatic hydrocarbon group which may have a substituent (for example, preferably an alkyl, aralkyl, aryl, alkoxy or halogeno group). $L^7$, $L^8$ and $L^9$ preferably each represents an alkylene group having 1 to 20 carbon atoms, an arylene group having 6 to 15 carbon atoms, and more preferably, an alkylene group of 1 to 8 carbon atoms. Moreover, if necessary, each of $L^7$, $L^8$ and $L^9$ may have another functional group that does not react with an isocyanate group, for example, a carbonyl, ester, urethane, amide, ureide, or ether group. Here, among $R^2$, $L^7$ , $L^8$ and $L^9$, two or three thereof may be bonded to one another to form a ring.

Ar represents a trivalent aromatic hydrocarbon group that may have a substituent(s), more preferably an aromatic group having 6 to 15 carbon atoms.

Specific examples of the diol compound having the carboxyl group (II) represented by formula (2), (3) or (4) are as follows: 3,5-dihydroxy benzoic acid, 2,2-bis (hydroxymethyl) propionic acid, 2,2-bis (2-hydroxyethyl)

propionic acid, 2,2-bis(2-hydroxyethyl) propionic acid, 2,2-bis(3-hydroxypropyl)propionic acid, bis(hydroxymethyl) acetic acid, bis(4-hydroxyphenyl)acetic acid, 2,2-bis (hydroxymethyl)butyric acid, 4,4-bis(4-hydroxyphenyl) pentanoic acid, tartaric acid, N,N-dihydroxyethyl glycine, N,N-bis(2-hydroxyethyl)-3-carboxy-propion amide or the like.

Compounds represented by the following formula (5), (6) and (7) are examples of the tetracarboxylic dianhydride (III) preferably used in synthesizing the polyurethane resin.

Formula (5)

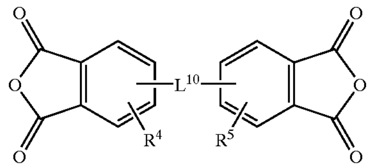

Formula (6)

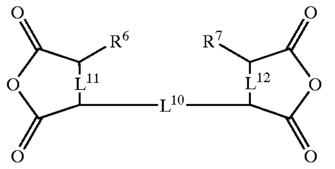

Formula (7)

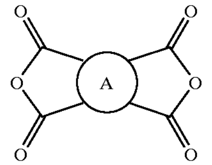

In the formulas, $L^{10}$ represents a single bond, or a bivalent aliphatic or aromatic hydrocarbon group, which may contain a substituent (for example, an alkyl, aralkyl, aryl, alkoxy, halogeno, ester or amide group), —CO—, —SO—, —$SO_2$, —O— or —S—. Preferably, $L^{10}$ represents a single bond, a bivalent aliphatic hydrocarbon group having 1 to 15 carbon atoms, —CO—, —$SO_2$—, —O— or —S—. $R^4$ and $R^5$ may be the same or different, and each represents a hydrogen atom, an alkyl, an aralkyl, aryl, alkoxy, or halogeno group, preferably, a hydrogen atom, an alkyl group having 1 to 8 carbon atoms, an aryl group having 6 to 15 carbon atoms, or an alkoxy or halogeno group having 1 to 8 carbon atoms. Moreover, among $L^{10}$, $R^4$ and $R^5$, two of them may be bonded to form a ring.

$R^6$ and $R^7$ may be the same or different, and each represents a hydrogen atom, an alkyl, an aralkyl, aryl, or halogeno group, and preferably, a hydrogen atom, an alkyl group having 1 to 8 carbon atoms, or an aryl group having 6 to 15 carbon atoms. Moreover, among $L^{10}$, $R^6$ and $R^7$, two of them may be bonded to form a ring. $L^{11}$ and $L^{12}$ may be the same or different, and each represents a single bond, a double bond, or a bivalent aliphatic hydrocarbon group, and preferably, a single bond, a double bond, or a methylene group. A represents a mononuclear or polynuclear aromatic ring. Preferably, A represents an aromatic ring having 6 to 18 carbon atoms.

Specific examples of the compounds represented by (5), (6) or (7) are listed as follows: pyromellitic dianhydride, 3,3',4,4'-benzophenone tetracarboxylic dianhydride, 3,3',4,4'-diphenyl tetracarboxylic dianhydride, 2,3,6,7-naphthalene tetracarboxylic dianhydride, 1,4,5,8-naphthalene tetracarboxylic dianhydride, 4,4'-sulfonyl diphthalic dianhydride, 2,2-bis(3,4-dicarboxyphenyl) propane dianhydride, bis(3,4-dicarboxyphenyl)ether dianhydride, and 4,4'-[3,3'-(alkylphosphoryldiphenylene)-bis(iminocarbonyl)]diphthalic anhydride, aromatic tetracarboxylic anhydrides such as an adduct of hydroquinone diacetate and trimellitic dianhydride and an adduct of diacetyldiamine and trimellitic dianhydride; alicyclic tetracarboxylic dianhydrides, such as 5-(2,5-dioxotetrahydrofuryl)-3-methyl-3-cyclohexene-1,2-dicarboxylic anhydride (EPICLON B-4400, made by Dainihon Ink Kagaku K.K.), 1,2,3,4-cyclopentane tetracarboxylic dianhydride, 1,2,4,5-cyclohexane tetracarboxylic dianhydride and tetrahydrofuran tetracarboxylic dianhydride; and aliphatic tetracarboxylic dianhydrides such as 1,2,3,4-butanetetracarboxylic dianhydride and 1,2,4,5-pentanetetracarboxylic dianhydride.

In the present invention, the tetracarboxylic dianhydride (III) is ring-opened by a diol compound (IV). Then, a structural unit derived from the resultant compound and an isocyanate compound (I) are allowed to react to produce a reaction product. This product forms a basic skeleton of the polyurethane having at least one carboxyl group of the present invention.

Examples of methods for introducing, into a polyurethane resin, the structural unit derived from the resultant compound obtained by ring-opening the tetracarboxylic dianhydride (III) by using the diol compound (IV) are as follows:

a) a method in which a compound having terminal end(s) of alcohol group obtained by ring-opening the tetracarboxylic dianhydride (III) by using the diol compound (IV), is allowed to react with the diisocyanate compound (I), and b) a method in which a urethane compound having terminal end(s) of alcohol group obtained by allowing the diisocyanate compound (I) to react under an excessive amount of the diol compound (IV), is allowed to react with the tetracarboxylic dianhydride (III).

Specific examples of the diol compound (IV) used when the tetracarboxylic dianhydride (III) is used to synthesize polyurethane in accordance with the present invention are as follows: ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an adduct of bisphenol A with ethylene oxide, an adduct of bisphenol A with propylene oxide, an adduct of bisphenol F with ethylene oxide, an adduct of bisphenol F with propylene oxide, an adduct of hydrogenated bisphenol A with ethylene oxide, an adduct of hydrogenated bisphenol A with propylene oxide, hydroquinone dihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl)isophthalate.

Other Diol Compounds

Moreover, in synthesizing the polyurethane having at least one carboxyl group of the present invention, another diol compound without a carboxyl group may be also used.

Examples of the diol compounds are broadly speaking polyether diol compounds, polyester diol compounds, polycarbonate diol compounds and the like.

Examples of polyether diol compounds are compounds represented by the following formulas (8), (9), (10), (11) and (12), and random copolymers of propylene oxide and ethylene oxide having a hydroxyl group at the terminal end(s) are listed.

Formula (8)

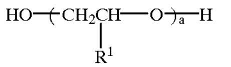

Formula (9)

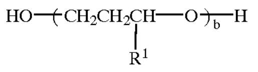

Formula (10)

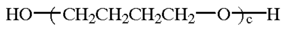

Formula (11)

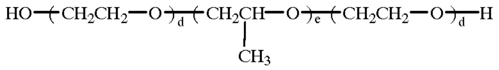

Formula (12)

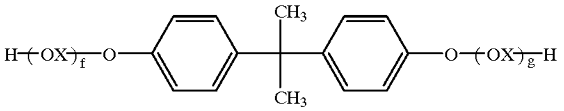

In the formulas, $R^1$ represents a hydrogen atom or a methyl group, and X represents the following group:

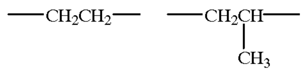

Here, each of a, b, c, d, e, f and g represents an integer of not less than 2, and preferably, an integer of 2 to 100.

Specific examples of polyether diol compounds represented by formulas (8) and (9) are as follows: diethylene glycol, triethylene glycol, tetraethylene glycol, pentaethylene glycol, hexaethyleneglycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000, polypropylene glycol having a weight-average molecular weight of 4000 and the like.

Specific examples of polyether diol compounds represented by formula (10) are as follows: PTMG650, PTMG1000, PTMG2000 and PTMG3000, made by Sanyo Kasei Kogyo K.K., and the like.

Specific examples of polyether diol compounds represented by formula (11) are as follows: Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, Newpol PE-61 and the like manufactured by Sanyo Kasei Kogyo K.K.

Specific examples of polyether diol compounds represented by formula (12) are as follows: Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, Newpol BPE-5P and the like manufactured by Sanyo Kasei Kogyo K.K.

Specific examples of the random copolymers of ethylene oxide and propylene oxide having a hydroxyl group at the terminal end(s) are as follows: Newpol 50HB-100, Newpol 50HB-260, Newpol 50HB-400, Newpol 50HB-660, Newpol 50HB-2000, Newpol 50HB-5100 and the like manufactured by Sanyo Kasei Kogyo K.K.

Examples of the polyester diol compound include compounds represented by formulas (13) and (14):

Formula (13)

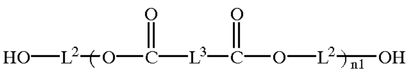

Formula (14)

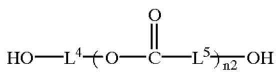

In the formulas, each of $L^2$, $L^3$ and $L^4$ may be the same or different, and represents a divalent aliphatic or aromatic hydrocarbon group, and $L^5$ represents a divalent aliphatic hydrocarbon group. More preferably, $L^2$, $L^3$ and $L^4$ respectively represent an alkylene group or an arylene group, and $L^5$ represents an alkylene group. Moreover, in $L^2$, $L^3$, $L^4$, and $L^5$, another functional group which does not react with an isocyanate group, such as an ether, carbonyl, ester, cyano, olefin, urethane, amide, or ureido group, or halogen atoms or the like may be contained. Here, group, n1 and n2 are each integers not less than 2, and preferably, are each integers of 2 to 100.

Examples of the polycarbonate diol compound are compounds represented by the following formula (15).

Formula (15)

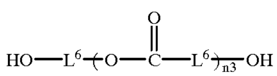

In the formula, $L^6$ may be the same or different, and represents a divalent aliphatic or aromatic hydrocarbon group. More preferably, $L^6$ represents an alkylene or arylene group. Moreover, in $L^6$, another functional group which does not react with an isocyanate group, such as an ether, carbonyl, ester, cyano, olefin, urethane, amide, or ureido group, or halogen atoms or the like may be contained. Here, n3 is integer of not less than 2, more preferably, an integer of 2 to 100.

Specific examples of the diol compounds represented by formulas (13), (14) and (15), include the following compounds. In these examples, n is an integer of not less than 2.

(No. 1)

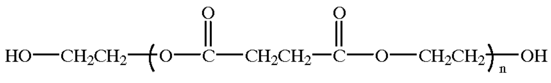

(No. 2)

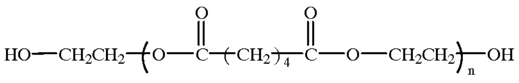

(No. 3)

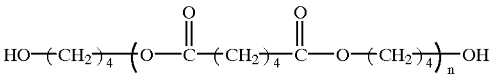

(No. 4)

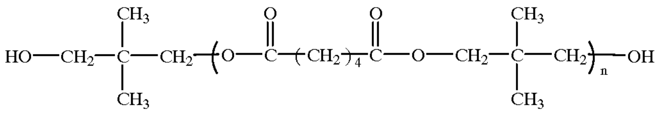

(No. 5)

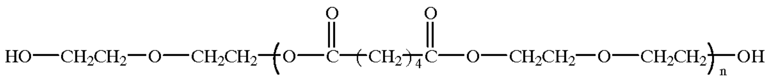

(No. 6)

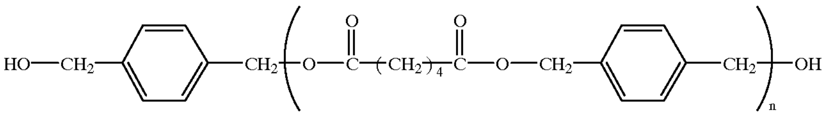

(No. 7)

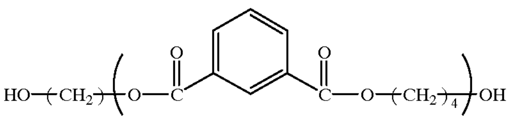

(No. 8)

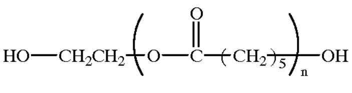

(No. 9)

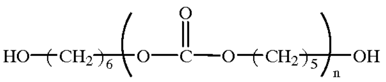

(No. 10)

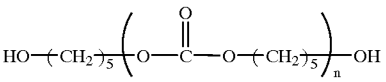

(No. 11)

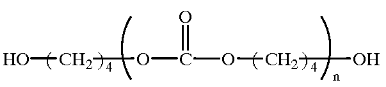

(No. 12)

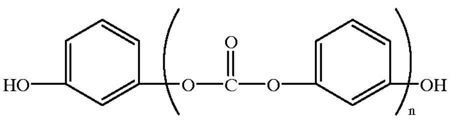

(No. 13)

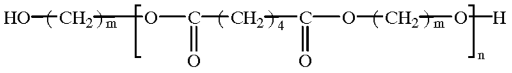

m = 2,4

Moreover, each of amino-group-containing compounds represented by the following formulas (16) and (17) may be allowed to react with the diisocyanate compound represented by the aforementioned formula (1), in the same manner as the aforementioned diol compound, so as to form a urea structure. Thus, such amino-group-containing compounds may be incorporated into the structure of the polyurethane.

Formula (16)

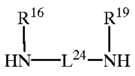

Formula (17)

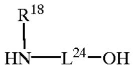

In the formulas, $R^{18}$ and $R^{19}$ may be the same or different, and each represents a hydrogen atom or an alkyl, aralkyl, or aryl group that may have a substituent (for example, groups such as an alkoxy, halogen atom (—F, —Cl, —Br, —I), ester, or carboxyl group). $R^{18}$ and $R^{19}$ are preferably a hydrogen atom, or an alkyl group having 1 to 8 carbon atoms or an aryl group having 6 to 15 carbon atoms that may contain at least one carboxyl group as a substituent.

$L^{24}$ represents a divalent aliphatic hydrocarbon group, aromatic hydrocarbon group, or heterocyclic group which may have a substituent (for example, an alkyl, aralkyl, aryl, alkoxy, aryloxy, halogen atom (—F, —Cl, —Br, —I) or carboxyl group. If necessary, in $L^{24}$, another functional group, which does not react with an isocyanate group, such as a carbonyl, ester, urethane or amide group, may be contained. Here, among $R^{18}$, $L^{24}$ and $R^{19}$, two of them may be bonded to each other to form a ring.

Specific examples of the compounds represented by formulas (16) and (17) are as follows: aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cystine and isophoronediamine; aromatic diamine compounds, such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl) sulfone, 4-carboxy-o-phenylenediamine, 3-carboxy-m-phenylenediamine, 4,4'-diaminophenylether and 1,8-naphthalenediamine; heterocyclic amine compounds, such as 2-aminoimidazole, 3-aminotriazole, 5-amino-1H-tetrazole, 4-aminopyrazole, 2-aminobenzimidazole, 2-amino-5-carboxy-triazole, 2,4-diamino-6-methyl-S-triazine, 2,6-diaminopyridine, L-histidine, DL-tryptophan and adenine; amino alcohols or aminophenol compounds, such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol and L-thyrosine.

The polyurethane resin having at least one carboxyl group in accordance with the present invention is synthesized by adding, to the isocyanate compounds and the diol compounds, a known catalyst(s) having activity to the isocyanate compounds and/or the diol compounds, and heating the resultant mixture. The molar ratio of the diisocyanate and the diol compound to be used is preferably set in the range of 0.8:1 to 1.2:1. In the case when the isocyanate group remains at the polymer terminal end, this end is treated by alcohols or amines so that the final synthesized resin has no residual isocyanate group.

Regarding to the diol compound used for the polyurethane containing at least one carboxyl group in the present invention, the diol component containing the carboxyl group is set to 50% to 100% by weight with respect to the total weight of all the diol components, and preferably 60% to 95%.

The content of the polyurethane containing the carboxyl group used in the present invention is set in the range of 30 to 90% by weight of the entire solid matter constituting the light-to-heat conversion layer, and preferably 40 to 85% by weight, and more preferably 50 to 80% by weight.

(B) Light-to-Heat Conversion Agent

Any of known substances having the function for converting laser light used for a writing process to heat (a light-to-heat conversion function) may be used as the light-to-heat conversion agent (light-to-heat conversion substance) used in the present invention. It has been known that, if the laser light source is an infrared laser, various organic and inorganic materials which absorb light of wavelengths used as a writing laser (such as infrared ray absorbing dyes, infrared ray absorbing pigments, infrared ray absorbing metals and infrared ray absorbing metal oxides) can be used as light-to-heat conversion agents.

Examples of these light-to-heat conversion agents include black dyes including various kinds of carbon black, such as acidic carbon black, basic carbon black and neutral carbon black, various kinds of carbon black which are surface-modified or surface-coated so as to improve the dispersing property and the like thereof, nigrosines, aniline black, cyanine black, green dyes such as phthalocyanines and naphthalocyanines, carbon graphite, aluminum, iron powder, diamine-based metal complex, dithiol-based metal complex, phenolthiol-based metal complex, mercaptophenol-based metal complex, aryl aluminum-based metal salts, crystal water-containing inorganic compounds, copper sulfide, chromium sulfide, silicon salt compounds, metal oxides such as titanium oxide, vanadium oxide, manganese oxide, iron oxide, cobalt oxide, tungsten oxide and indium-tin oxide, hydroxides and sulfates of these metals and additives of metal powder such as bismuth, tin, tellurium, iron and aluminum. In addition, various compounds serving as organic pigments disclosed in the following references and publications may be used: "Infrared Sensitizing Dyes", by Matsuoka (Plenum Press, New York, 1990); U.S. Pat. Nos. 4,833,124, 4,772,583, 4,942,141, 4,948,776, 4,948,777, 4,948,778, 4,950,639, 4,912,083, 4,952,552, and 5,023,229 and European Patent Application Laid-Open (EP) 321,923. However, the present invention is not intended to be limited thereto.

Among these, carbon black is preferably used from the standpoints of the light-to-heat conversion rate, economy and ease in handling.

Based upon the method of manufacturing thereof, carbon black is classified into Furnace Black, Lamp Black, Channel Black, Roll Black, Disk Black, Thermal Black, Acetylene Black and the like. Among these, since Furnace Black is commercially available in many types in particle sizes, etc., and is economical, it is preferably used.

In the case of carbon black, the degree of coagulation of the primary particles thereof affects the plate material sensitivity. In the case when the degree of coagulation of the primary particles in carbon black is high (that is, has a high structure composition), a black level of plate material is lowered. That is, the black level of the plate material comprising the carbon black of high degree of coagulation is lower than that of a plate material comprising the carbon black of low degree of coagulation. Therefore, when the degree of coagulation is high, the absorbing rate of the laser light is lowered, resulting in a reduction in the sensitivity. Moreover, due to the particle coagulation, the light-to-heat conversion layer coating solution becomes more viscosity, or comes to have a thixotropic property, thereby causing difficulty in handling the coating solution and subsequent failure to provide a uniform coat film. In contrast, when the amount of oil absorption of carbon black is low, the dispersing property of the carbon black is lowered, also resulting in a reduction in the sensitivity. The degree of coagulation of the primary particles of the carbon black can be compared by using a value, which express the amount of oil absorption. The higher the oil absorption, the greater the degree of coagulation, and the lower the oil absorption, the lower the degree of coagulation. In other words, it is preferable to use a carbon black whose amount of oil absorption is in the range of 20 to 200 ml/100 g, more preferably, 40 to 120 ml/100 g.

Moreover, carbon black is commercially available in various particle sizes, and the particle size of the primary particles also affects the plate material sensitivity. When the average particle size of the primary particles is too small, the light-to-heat conversion layer itself tends to become transparent, failing to efficiently absorb laser light and resulting in a reduction in the plate material sensitivity. In contrast, when the particle size is too large, the particles are not dispersed in highly dense manner, with the result that the black level of the light-to-heat conversion layer does not increase, such that laser light cannot be absorbed efficiently and the plate material sensitivity is reduced. In other words, it is preferable to use carbon black having an average particle size of the primary particle size in the range of 10 to 50 nm, and more preferably 15 to 40 nm.

Here, the use of a conductive carbon black makes it possible to improve the plate material sensitivity. In this case, the electrical conductivity is preferably set in the range of $0.01^{-1}$ $cm^{-1}$ to $100^{-1}$ $cm^{-1}$, and more preferably, $0.1^{-1}$ $cm^{-1}$ to $10^{-1}$ $cm^{-1}$. More specifically, the following products are more preferably used: "CONDUCTEX" 40-220, "CONDUCTEX" 975 BEADS, "CONDUCTEX" 900 BEADS, "CONDUCTEX" SC, "BATTERY BLACK" (made by Colombian Carbon Japan (K.K.)), #3000 (made by Mitsubishi Kagaku (K.K.)), "Denka Black" (made by Denki Kagaku (K.K.)), "VULCAN XC-72R" (made by Cabot Co.), and the like.

Here, as described earlier, from the standpoint of environmental problems, the light-to-heat conversion layer of the present invention is preferably set so as not to contain any self-oxidizing nitrogen-containing compound that generates nitrogen oxides due to thermal decomposition. These self-oxidizing nitrogen-containing compounds include nitro compounds such as nitrocellulose, ammonium nitrate, potassium nitrate, azo compounds, diazo compounds, and hydrazine derivatives.

The added amount of the light-to-heat conversion agent of the present invention is set in the range of 5 to 70% by weight with respect to all of the solid material forming the light-to-heat conversion layer, and more preferably 10 to 50% by weight. An added amount of less than 5% by weight results in a reduction in the sensitivity, and an added amount greater than 70% by weight results in a reduction in the film strength of the light-to-heat conversion layer and a subsequent reduction in the adhering property to the adjacent layer.

In addition to the above-mentioned components (A) and (B), a known binder for dissolving or dispersing the light-to-heat conversion material may be added to the light-to-heat conversion layer of the present invention.

Examples thereof include: homopolymers and copolymers of acrylates or methacrylates such as polymethylmethacrylate and polybutylmethacrylate; homopolymers and copolymers of styrene-based monomers such as polystyrene and α-methylstyrene; various synthetic rubbers such as isoprene and styrene-butadiene; homopolymers and copolymers of vinyl esters such as polyvinyl acetate and vinyl acetate-vinyl chloride; various condensation polymers such as polyurea, polyurethane, polyester and polycarbonate; and binders used in so-called "chemical amplification system" described in "J. Imaging Sci.", P59–64, 30(2), (1986) (Frechet et al.) and "Polymers in Electronics" (Symposium Series, P11, 242, T. Davidson, Ed., ACS Washington, D.C. (1984)(Ito, Willson) and "Microelectronic Engineering", P3–10,13(1991)(E. Reichmanis, L. F. Thompson). The added amount is set in the range of 1 to 30% by weight, and more preferably 5 to 20% by weight.

Other known additives may be used in the light-to-heat conversion layer of the present invention for their respective purposes, as long as they do not impair the effects of the present invention. These additives are added for various purposes such as an improvement of the mechanical strength of the light-to-heat conversion layer, an improvement of the laser recording sensitivity, an improvement of the dispersing property of the dispersant in the light-heat conversion layer and an improvement of the adhering property to an adjacent layer such as the support member, primary layer or silicon rubber layer.

For example, in order to improve the mechanical strength of the light-to-heat conversion layer, any of various cross-linking agents for curing the light-to-heat conversion layer may be added. The addition of a cross-linking agent allows the light-to-heat conversion layer to have a cross-linked structure. Here, since the waterless planographic printing plate precursor of the present invention uses polyurethane having at least one carboxyl group for forming a light-to-heat conversion layer, the carboxyl group serves as a reaction site at the time of cross-linking, thereby providing a dense cross-linked structure. For this reason, the resulting advantage is that even when a developing process is carried out using a developing solution containing a solvent, it is possible to effectively prevent a reduction in the adhesive property of the non-image portions.

The applicable cross-linking agent is not particularly limited, and known cross-linking agents may be properly selected and used. Specific examples thereof include: combinations of a multifunctional isocyanate compound or a multifunctional epoxy compound and a hydroxide-group-containing compound, carboxylic acid compound, thiol-based compound, amine-based compound, urea-based compound and the like. However, the present invention is not intended to be limited by these.

The added amount of the cross-linking agent used in the present invention is set in the range of 1 to 30% by weight with respect to the entire solid component of the light-to-heat conversion layer, and more preferably 2 to 20% by weight. An added amount less than 1% by weight fails to obtain sufficient effects of the cross-linking agent, and an added amount exceeding 30% by weight causes the film strength of the light-to-heat conversion layer to become too strong, resulting in a reduction in the plate material sensitivity.

In the case when a pigment such as carbon black is used as the light-to-heat conversion agent, any of various pigments dispersing agents may be added so as to improve the level of dispersion of the pigment.

The added amount of the pigment dispersing agent used in the present invention is set in the range of 1 to 70% by weight, and preferably 5 to 50% by weight, with respect to the light-to-heat conversion agent. An added amount less than 1% by weight causes a reduction in the improvement of the dispersing property of the pigment, and a subsequent reduction in the plate material sensitivity. An added amount exceeding 70% by weight causes a reduction in the adhering strength to the adjacent layer.

In order to improve the adhesive property to the adjacent layer, a known adhesive property-improving agent, such as a coupling agent or a titanate-coupling agent, may be added.

The added amount of the adhesive property improving agent is set in the range of 5 to 30% by weight, and preferably 10 to 20% by weight, with respect to the entire solid component of the light-to-heat conversion layer.

Moreover, in order to improve the coating property of the light-to-heat conversion layer coating solution, a surface active agent such as a fluorine-based surface active agent or a nonionic surface active agent may be used as an additive agent.

The added amount of the surface active agent used in the present invention is set in the range of 0.01 to 3% by weight, and preferably 0.05 to 1% by weight, with respect to the entire solid component of the light-to-heat conversion layer.

In addition to these, various additive agents may be used as needed.

The film thickness of the light-to-heat conversion layer is set in the range of 0.05 to 10 $\mu$m, and preferably 0.1 to 5 $\mu$m.

A film thickness of the light-to-heat conversion layer less than 0.05 μm fails to obtain a sufficient optical density, resulting in a reduction in the laser recording sensitivity and a subsequent degradation in the image quality due to a difficulty in the formation of a uniform film. A film thickness exceeding 10 μm is not preferable from the standpoint of the production costs.

Silicone Layer

The ink-repellant silicon rubber layer of the present invention is obtained by forming a coat film of silicone rubber on the light-to-heat conversion layer. More specifically, a condensation-type silicone is cured by using a cross-linking agent or an addition-type silicone is addition-polymerized thereon by a catalyst.

In a case in which a condensation type silicone is used, it is preferable to use a composition formed by adding 3 to 70 parts by weight of a condensation-type cross-linking agent (b) and 0.01 to 40 parts by weight of a catalyst (c) to 100 parts by weight of diorganopolysiloxane (a).

The diorganopolysiloxane of the component (a) is a polymer having a repeating unit as represented by the following formula. $R^1$ and $R^2$ represent an alkyl group, a vinyl group or an aryl group having 1 to 10 carbon atoms, and this may have another appropriate substituent. In general, it is preferable that not less than 60% of $R^1$ and $R^2$ are composed of a methyl group, a vinyl halide group, or a phenyl halide group.

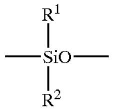

Diorganopolysiloxanes having hydroxyl groups on both of the terminal ends are preferably used.

Moreover, the aforementioned component (a)(i.e., the diorganopolysiloxane) has a number average molecular weight of 3,000 to 600,000, and preferably 5,000 to 100,000.

Any cross-linking agent may be used as the cross-linking agent of component (b), as long as it is of a condensation type. However, the cross-linking agent represented by the following formula is preferably used.

$R^1_m.Si.X_n$ ($m+n=4$, $n$ is not less than 2)

Here, $R^1$ is the same as the above-mentioned $R^1$, and X represents a halogen atom such as Cl, Br and I, a hydrogen atom, a hydroxyl group or an organic substituent as shown below.

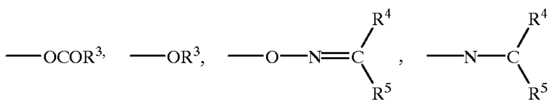

In the formula, $R^3$ represents an alkyl group having 1 to 10 carbon atoms and an aryl group having 6 to 20 carbon atoms, and $R^4$ and $R^5$ represent alkyl groups having 1 to 10 carbon atoms.

With respect to component (c), known catalysts including metal carboxylates of tin, zinc, lead, calcium, and manganese, for example, tin dibutyl laurate, lead octylate, lead naphthenate, and the like, or chloroplatinic acid, may be used.

When addition-type silicone is used, it is preferable that a composition is used in which, to 100 parts by weight of (d) diorganopolysiloxane having an addition reactive functional group is added 0.1 to 25 parts by weight of (e) organohydrogen polysiloxane and 0.00001 to 1 parts by weight of (f) addition catalyst.

The above-mentioned component (d) diorganopolysiloxane having an addition reactive functional group is an organopolysiloxane having in a molecule at least two alkenyl groups (preferably vinyl groups) directly bonded to silicon atoms. The alkenyl groups may be at the terminal ends or middle of the molecules. Moreover, a substituted or unsubstituted alkyl group or aryl group, having 1 to 10 carbon atoms, may be added thereto as an organic group other than the alkenyl group. Moreover, the component (d) may contain a minute amount of hydroxyl group, if necessary. The number-average molecular weight of component (d) is preferably from 3,000 to 600,000, and more preferably from 5,000 to 100,000.

Examples of component (e) include: polydimethyl siloxane having a hydroxyl group at both terminal ends, α, ω-dimethyl polysiloxane, copolymers of (methyl siloxane)-(dimethyl siloxane) having a methyl group at both terminal ends, annular polymethyl siloxane, polymethyl siloxane having a trimethyl silyl group at both terminal ends, and copolymers of (dimethyl siloxane)-(methyl siloxane) having a trimethyl silyl group at both terminal ends.

Component (f) (i.e., addition catalyst (f)) may be optionally selected from known polymerization catalysts. However, platinum based compounds are particularly desirable and examples thereof include platinum, platinum chloride, chloroplatinic acid, olefin coordinated platinum, and the like.

In order to control the rate of curing of the silicone rubber layer in these compositions, it is also possible to add a cross-linking control agent such as an organopolysiloxane containing a vinyl group such as tetracyclo (methyl vinyl) siloxane, an alcohol having a carbon-carbon triple bond, acetone, methyl ethyl ketone, methanol, ethanol, propylene glycol monomethyl ether, and the like.

Note that, if necessary, adhesion aids and photopolymerization initiator agents such as fine powders of inorganic substances, such as silica, calcium carbonate and titanium oxide, silane coupling agents, titanate based coupling agents, and aluminum based coupling agents may be added to the silicone rubber layer.

The film thickness of the ink-repellant silicone rubber layer is preferably set in the range of 0.5 to 5 $g/m^2$ in a dried state, and more preferably 1 to 3 $g/m^2$. A film thickness of less than 0.5 $g/m^2$ causes a reduction in the ink repellency, and the problem of scratches. A film thickness of greater than 5 $g/m^2$ results in degradation in the image reproducibility.

Moreover, in the waterless plate precursor of the present invention, various silicone rubber layers may be further provided on the silicone rubber layer, in order to improve the ability to withstand repeated printings, scratch resistant property, image reproducibility and stain resistant property.

The silicone rubber layer of the waterless plate precursor of the present invention is soft, and susceptible to scratches. Therefore, in order to protect the surface thereof, a transparent film made of, for example, polyester such as polyethyleneterephthalate or polyethylene naphthalate, polyethylene, polypropylene, polystyrene, polyvinyl chloride, polyvinylidene chloride, polyvinyl alcohol, cellophane, or the like, maybe laminated on the silicone rubber layer, or a polymer coating may be applied thereon as a surface protective layer. These films may be elongated and applied thereon, or a matting process thereof may be carried out on the surface. From the standpoint of image reproducibility, it is preferable to avoid the matting process in the present invention.

Support Member

The waterless plate precursor of the present invention needs to have sufficient flexibility to enable it to be set on a normal printing machine, yet at the same time, it needs to be able to withstand the load imposed thereon during printing. Accordingly, typical support members include coated paper, metallic plates such as aluminum, plastic films such as polyethylene terephthalate, rubber, or composites thereof. Preferable examples thereof include coated paper, aluminum plates and aluminum containing alloy plates (e.g. alloys of aluminum and metals such as silicon, copper, manganese, magnesium, chrome, zinc, lead, bismuth, and nickel) as well as plastic films. Further, two or more kinds of these support members may be laminated, or bonded with a bonding agent or the like.

In order to improve the surface adhesive property, anti-static property and the like, various surface treatments, such as a corona discharging process, a pre-matting bonding process, a static-eliminating process and the like may be carried out.

The thickness of the support member is in the range of 25 $\mu$m to 3 mm, preferably, and preferably 75 $\mu$m to 500 $\mu$m. However, the optimal thickness differs depending on the kind of the support member to be used and the conditions of printing. In general, the thickness is preferably in the range of 100 $\mu$m to 300 $\mu$m.

Primer Layer

In the present invention, a primer layer may be provided between the support member and the light-to-heat conversion layer. With respect to the primer layer of the present invention, various kinds thereof may be used so as to improve the adhesive property between the substrate and the light-to-heat conversion layer and the printing characteristics.

Examples of the primer layer which may be used in the present invention include: those obtained by exposing and curing various photosensitive polymers before forming a photosensitive resin layer thereon, as disclosed in JP-A No. 60-22903; those obtained by heat curing epoxy resins, as disclosed in JP-A No. 62-50760; those obtained by forming the gelatins into a hard film as disclosed in JP-A No. 63-133151; those using a silane coupling agents and urethane resins as disclosed in JP-A No. 3-200965; and those using urethane resins as disclosed in JP-A No. 3-273248. In addition to these, gelatin or casein formed into a hard film is also effective.

In order to soften the primer layer, a polymer having a glass transition temperature of room temperature or lower such as a polyurethane, polyamide, styrene/butadiene rubber, carboxy modified styrene/butadiene rubber, acrylonitrile/butadiene rubber, carboxy modified acrylonitrile/butadiene rubber, polyisoprene, acrylate rubber, polyethylene, polyethylene chloride, polypropylene chloride, or the like may be added to the primer layer. The added amount is optional and, as long as a film layer is formed, the primer layer may be formed solely from additives.

Moreover, in order to soften the primer layer, it is also possible to add other additives to the primer layer, such as dyes, pH indicators, printout agents, photopolymerization initiators, adhesion aids (e.g. polymeric monomers, diazo resins, silane coupling agents, titanate coupling agents and aluminum coupling agents), pigments, silica powder, and titanium oxide powders. Moreover, after the coating process, they can be cured by exposure.

Generally, the preferable weight of the dried primer layer is in the range of 0.1 to 10 g/m$^2$, preferably from 0.3 to 7 g/m$^2$, and more preferably from 0.5 to 5 g/m$^2$.

The waterless planographic printing plate precursor of the present invention is obtained by processes in which, after placing the primer layer desirably on the support member, a light-to-heat conversion layer is formed and a silicon layer is then formed thereon.

The waterless planographic printing plate precursor is exposed in accordance with a pattern, and then developed to form the resulting waterless planographic printing plate.

The type of laser used in exposing the waterless planographic printing plate precursor of the present invention is not particularly limited as long as it can provide the necessary amount of exposure for the adhesion to be sufficiently lowered so that the silicone rubber layer can be peeled off and removed from the support member. Gas lasers such as Ar lasers and carbon dioxide lasers, solid lasers such as YAG lasers, and semiconductor lasers may be used. A laser in the 50 mW or more constant output class is necessary. For practical reasons, such as maintainability and cost, a semiconductor laser or a semiconductor excitation solid laser (such as a YAG laser) is preferably used.

The recording wavelength of these lasers is in the infrared wavelength range, and an oscillating wavelength of between 800 nm to 1100 nm is often used.

It is also possible to perform the exposure using an imaging device described in JP-A No. 6-186750.

In the case when a film is provided to protect the surface of the silicone rubber layer, the film may be peeled off before exposure, or may be exposed with the silicone rubber layer. That is, for example, if the film is transparent to the laser light used, the surface of the silicone rubber layer may either be exposed with the film in place or the surface of the silicone rubber layer may be exposed after the film has been peeled off.

The exposure with the infrared laser allows the light-to-heat conversion layer at the exposed portions to react. The reaction causes a reduction in the adhesive strength between the support member and the light-to-heat conversion layer having the silicone rubber layer thereon. The ink repellant layer at the exposed portions is removed during the succeeding developing process so that image portions, serving as an ink affinity areas, are formed. The silicone rubber layer at the unexposed portions forms non-image portions serving as ink repellant areas. Thus, a desired waterless planographic printing plate is obtained.

With respect to the developing solution used during the formation of the waterless plate precursor of the present invention, known solutions used for developing waterless planographic printing plate precursors may be used. For example, hydrocarbons, polar solvents, water and the like, or combinations of these maybe used. However, from the standpoint of safety, it is preferable to use water or a water solution of an organic solvent mainly composed of water. In view of safety and inflammability, the concentration of the organic solvent in the developing solution is preferably set to less than 40% by weight.

Examples of hydrocarbons to be used in the developing solution include aliphatic hydrocarbons (e.g. hexane, heptane, gasoline, kerosene, and a commercially available solvent, "Isopar E, H, G" (manufactured by Esso Chemicals Ltd.), and the like), aromatic hydrocarbons (e. g. toluene, xylene, and the like), hydrocarbon halides (e.g. trichlene), and the like. Examples of the polar solvent include alcohols (e.g. methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monoethyl ether, propylene glycol monoethyl ether, dipropylene glycol monomethyl ether, polyethylene glycol monomethyl ether, polypropylene glycol, tetraethylene glycol, and the like), ketones (e.g. acetone, methyl ethyl ketone, and the like), esters (e.g. ethyl acetate, methyl lactate, butyl lactate, propylene glycol monomethyl ether acetate, diethylene glycol acetate, diethyl phthalate, and the like), triethyl phosphate, tricresyl phosphate, and the like. Here, water itself, such as tap water, pure water or distilled water, may be simply used.

These developing solutions may be used alone, or, for example, water may be added to a hydrocarbon, or water may be added to a polar solvent, or a hydrocarbon and a polar solvent may be combined. Thus, two or more of them may be used in combination.

In the case when, in adjusting the developing solution, among the hydrocarbons and polar solvents, one having a low affinity to water is used, a surface active agent or the like may be added to the solution in order to improve the solubility to water. Moreover, in addition to the surface active agent, an alkali agent (for example, sodium carbonate, diethanol amine, sodium hydroxide, etc.) may also be added thereto.

The developing process may be carried out by using a known method, such as rubbing the plate surface with a developing pad containing the developing solution or rubbing the plate surface with a developing brush in water after the developing solution has been poured onto the plate surface.

The temperature of the developing solution is arbitrarily set. However, a temperature between 10° C. to 50° C. is preferable. Thus, the silicone rubber layer that is the ink repellant layer at the image portions is removed, thereby allowing these portions to become an image receiving portions.

The above-mentioned developing process and the succeeding washing and drying processes may be carried out by an automatic processing machine. A preferable example of such an automatic processing machine is disclosed in JP-A No. 2-220061.

Moreover, the waterless planographic printing plate precursor may be developed by a process in which, after affixing an adhesive layer onto the surface of the silicone rubber layer, the adhesive layer is peeled off therefrom. With respect to the adhesive layer, any of known layers that can be adhered to the surface of the silicone rubber layer may be used. With respect to the product formed by placing such an adhesive layer onto a flexible support member, for example, the product "Scotch Tape #851A" (trade name, made by Sumitomo 3M K.K.) is commercially available.

Furthermore, in the case when printing plates processed as described above are stored in a stacked state, it is preferable to interpose interleaf sheets between the printing plates.

EXAMPLES

A detailed explanation will be given of the present invention by means of Examples. However, the present invention is not intended to be limited thereby.

Synthesis Example 1

Polyurethane 1

In a three-neck round-bottomed flask of 500 ml having a condenser and a stirrer, 12.1 g (0.09 mol) of 2,2-bis(hydroxymethyl) propionic acid and 20.0 g (0.01 mol) of a polyester diol compound (SANESTER 24620, made by Sanyo Kasei (K.K.)), were dissolved in 100 ml of N,N-dimethyl acetamide. To this mixture were added 20.0 g (0.08 mol) of 4,4'-diphenylmethane diisocyanate and 3.4 g (0.02 mol) of hexamethylene diisocyanate, and the resultant mixture was heated to 100° C. and stirred for 5 hours. Thereafter, the mixture was diluted with 200 ml of N,N-dimethyl formamide and 400 ml of methyl alcohol. This reaction solution was placed into 4 liters of water while stirring was carried out, and a white polymer was deposited. This polymer was filtrated, washed with water, and then dried in vacuum to obtain 50 g of the polymer.

The molecular weight thereof was measured by the gel-permeation chromatography (GPC) method, and an average weight (polystyrene standard) of 50,000 was obtained.

Synthesis Example 2

Polyurethane 14

In N,N-dimethyl acetamide (100 ml) were dissolved 10.3 g (0.077 mol) of 2,2-bis(hydroxymethyl) propionic acid and 23.0 g (0.023 mol) of polypropylene glycol (weight-average molecular weight: 1000). To this solution were added 20.0 g (0.08 mol) of 4,4'-diphenylmethane diisocyanate and 3.4 g (0.02 mol) of hexamethylene diisocyanate, and this was allowed to react and processed in the same manner as in Synthesis Example 1. Thus, 80 g of a white polymer was obtained. The molecular weight thereof was measured by the gel-permeation chromatography (GPC) method, and an average weight (polystyrene standard) of 50,000 was obtained.

Thereafter, in the same manner as Synthesis Examples 1 and 2, polyurethane resins of the present invention were synthesized by using the diisocyanate compounds and diol compounds as shown in Tables 1 to 4. Moreover, the molecular weights were measured by using the GPC. The results of measurements are shown in Tables 1 to 4. However, polyurethanes to be used in the present invention are not intended to be limited by the following products.

TABLE I

| PEU | Diisocyanate compound used (mol %) | Diol compound used (mol %) | Mw(*) |
|---|---|---|---|
| 1 | 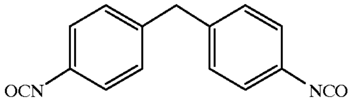 80; $OCN(CH_2)_6NCO$ 20 | 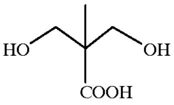 90; $HO(CH_2)_m-[OCO(CH_2)_4CO_2(CH_2)_m]_n-OH$ m = 2,4 MW:2000 10 | 50,000 |
| 2 | 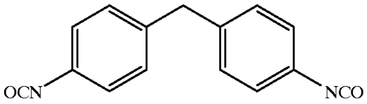 100 | 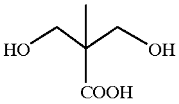 90; $HO(CH_2)_4-[OCO(CH_2)_4CO_2(CH_2)_4]_n-OH$ MW:2000 10 | 80,000 |
| 3 | 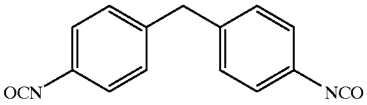 100 | 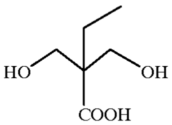 95; $HO(CH_2)_4-[OCO(CH_2)_4CO_2(CH_2)_4]_n-OH$ MW:2000 5 | 55,000 |
| 4 | 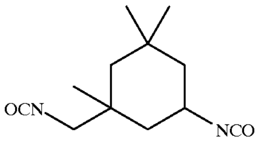 100 | 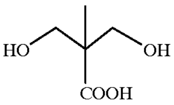 90; $HO(CH_2)_m-[OCO(CH_2)_4CO_2(CH_2)_m]_n-OH$ m = 2,4 MW:2000 10 | 45,000 |
| 5 |  100 | 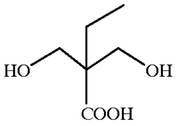 80; $HO(CH_2)_4-[OCO(CH_2)_4CO_2(CH_2)_4]_n-OH$ MW:2000 20 | 87,000 |
| 6 | 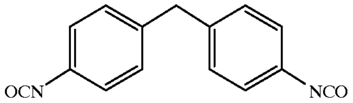 80; $OCN(CH_2)_6NCO$ 20 | 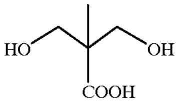 75; $HO(CH_2)_2-[OCO(CH_2)_5]_n-OH$ MW:1500 25 | 37,000 |

(*)Weight-average molecular weight

TABLE 2

| PEU | Diisocyanate compound used (mol %) | Diol compound used (mol %) | Mw(*) |
|---|---|---|---|
| 7 | 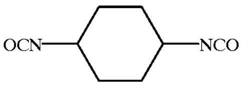 100 | 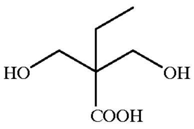 90; $HO(CH_2)_4-[OCO(CH_2)_4CO_2(CH_2)_4]_n-OH$ MW:1000 10 | 25,000 |
| 8 | 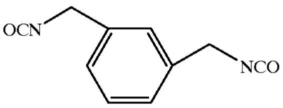 100 | 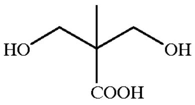 80; $HO(CH_2)_m-[OCO(CH_2)_4CO_2(CH_2)_m]_n-OH$ m = 2,4 MW:2000 20 | 48,000 |

TABLE 2-continued
| PEU | Diisocyanate compound used (mol %) | Diol compound used (mol %) | Mw(*) |
|---|---|---|---|
| 9 | 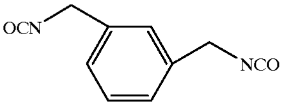 100 | 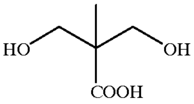 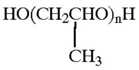 90 MW:1000 10 | 32,000 |
| 10 | 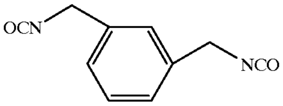 $OCN(CH_2)_6NCO$ 80 20 | 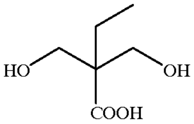 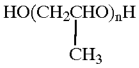 95 MW:1000 10 | 63,000 |
| 11 | 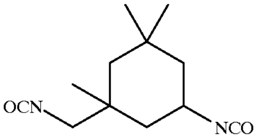 100 | 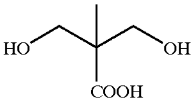 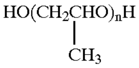 80 MW:1000 20 | 22,000 |
| 12 | 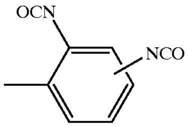 $OCN(CH_2)_6NCO$ 80 20 | 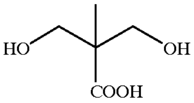 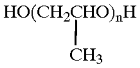 90 MW:2000 10 | 53,000 |
(*)Weight-average molecular weight
TABLE 3
| PEU | Diisocyanate compound used (mol %) | Diol compound used (mol %) | Mw(*) |
|---|---|---|---|
| 13 | 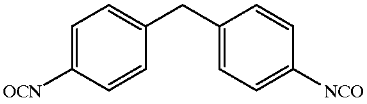 100 | 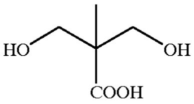 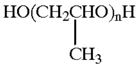 90 MW:1000 10 | 35,000 |
| 14 | 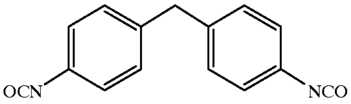 $OCN(CH_2)_6NCO$ 80 20 | 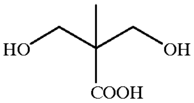 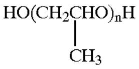 77 MW:1000 23 | 50,000 |
| 15 | 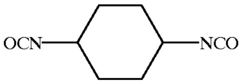 100 | 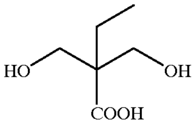 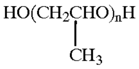 75 MW:700 25 | 26,000 |
| 16 | 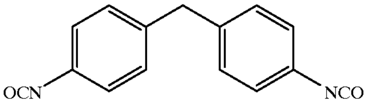 100 | 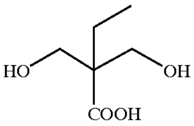 $HO(CH_2)_4H$ 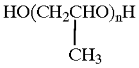 80 10 MW:1000 10 | 45,000 |

TABLE 3-continued
| PEU | Diisocyanate compound used (mol %) | Diol compound used (mol %) | Mw(*) |
|---|---|---|---|
| 17 | 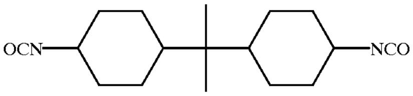 100 | 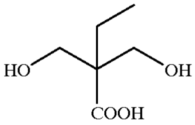 80; $H(CH_2CH_2O)_nH$ MW:400 20 | 38,000 |
| 18 | 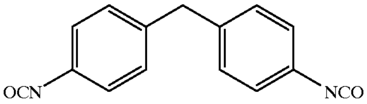 100 | 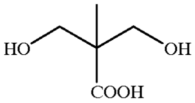 90; $H(CH_2CH_2O)_nH$ MW:1000 10 | 72,000 |
(*)Weight-average molecular weight
TABLE 4
| PEU | Diisocyanate compound used (mol %) | Diol compound used (mol %) | Mw(*) |
|---|---|---|---|
| 19 | 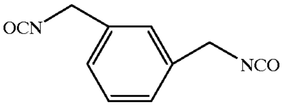 100 | 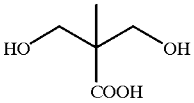 75; $H(CH_2CH_2O)_nH$ MW:400 25 | 53,000 |
| 20 | 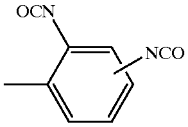 100 | 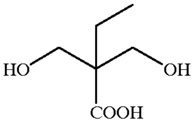 85; $H(CH_2CH_2O)_nH$ MW:2000 5; $HO(CH_2)_4OH$ 10 | 32,000 |
| 21 | 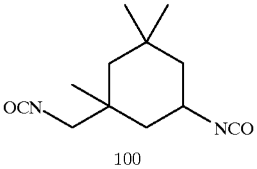 100 | 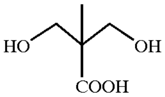 80; $H(CH_2CH_2O)_nH$ MW:200 15; 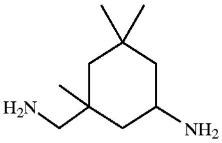 5 | 45,000 |
| 22 | 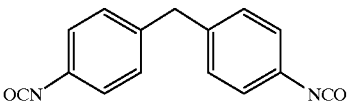 75; $OCN(CH_2)_6NCO$ 25 | 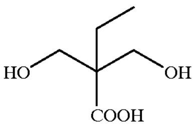 90; $HO(CH_2)_2-[OCO(CH_2)_5]_n-OH$ MW:2000 10 | 55,000 |
| 23 | 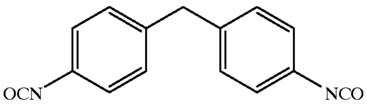 100 | 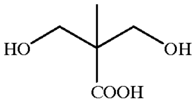 85; $HO(CH_2CH_2O)_n(CH_2CH(CH_3)O)_mH$ Random copolymer MW:2000 15 | 28,000 |

TABLE 4-continued

| PEU | Diisocyanate compound used (mol %) | Diol compound used (mol %) | Mw[(*)] |
|---|---|---|---|
| 24 | 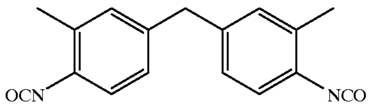 100 | 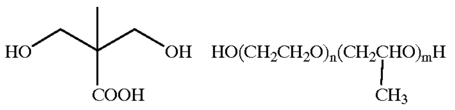 90 Random copolymer MW:2000 10 | 72,000 |

[(*)]Weight-average molecular weight

Examples 1 to 8, Comparative Examples 1 to 4

Formation of Light-to-Heat Conversion Layer

The following mixed solution was stirred with glass beads in a paint shaker for 30 minutes so that the carbon black was dispersed. After the glass beads had been filtrated and removed, to this was added 0.2 parts by weight of a fluorine-based surface active agent MEGAFAC F177 (manufactured by Dainihon Ink Kagaku Kogyo K.K.), and the mixture was stirred to form a light-to-heat conversion layer coating solution. This coating solution was coated on a transparent polyethylene terephthalate film, which had a thickness of 188 μm and had been subjected to a corona treatment, so as to form a film having a dried film thickness of 1 μm, and then heated and dried to form a light-to-heat conversion layer.

| | |
|---|---|
| *Polymer listed in TABLE 5 | 75 parts by weight |
| *Carbon Black (#40, made by Mitsubishi Carbon (K.K.)) | 25 parts by weight |
| *SOLSPERSE S27000 (made by ICI K.K.) | 2 parts by weight |
| *Propylene glycol monomethylether | 1000 parts by weight |

TABLE 5

| Sample | Binder | Plate material sensitivity (mJ/cm$^2$) | Generation of nitrogen oxide (mg) |
|---|---|---|---|
| Example 1 | Polyurethane 1 | 120 | None detected |
| Example 2 | Polyurethane 3 | 110 | None detected |
| Example 3 | Polyurethane 11 | 105 | None detected |
| Example 4 | Polyurethane 12 | 110 | None detected |
| Example 5 | Polyurethane 13 | 105 | None detected |
| Example 6 | Polyurethane 19 | 110 | None detected |
| Example 7 | Polyurethane 20 | 115 | None detected |
| Example 8 | Polyurethane 23 | 105 | None detected |
| Comparative Example 1 | Polyurethane A (60 wt %) Nitrocellulose (40 wt %) | 110 | 1.3 |
| Comparative Example 2 | Polyurethane B (70 wt %) Nitrocellulose (30 wt %) | 100 | 1.2 |
| Comparative Example 3 | Polyurethane A | 245 | None detected |
| Comparative Example 4 | Phenol novolak (MW: 50,000) | 225 | None detected |

(Polyurethane A)

Diisocyanate compound:

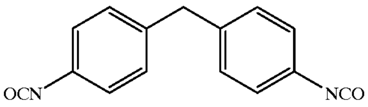

80 mol %

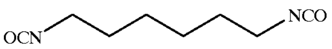

20 mol %

Diol compound: 1,4-butanediol 90 mol %

10 mol %

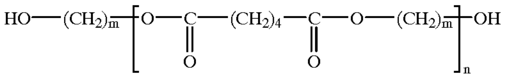

m = 2, 4 MW: 2000

(Polyurethane B)

Diisocyanate compound

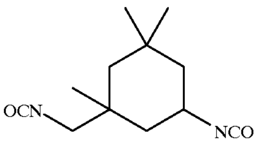

100 mol %

Diol compound: 1,4-butanediol 80 mol %

Propylene glycol (MW: 1000) 20 mol %

Formation of Silicone Rubber Layer

The following coating solution was applied to the light-to-heat conversion layer, and heated (130° C., 1 minute) and dried to form an addition-type silicone rubber layer having a dried film thickness of 2 μm.

| | |
|---|---|
| *α, ω-divinylpolydimethylsiloxane (Degree of polymerization 500) | 9 parts by weight |
| *$(CH_3)_3SiO(SiH(CH_3)O)_8$—$Si(CH_3)_3$ | 0.2 parts by weight |
| *Olefin-chloroplatinic acid | 0.15 parts by weight |
| *Control agent [HC≡C—$C(CH_3)_2$—O—$Si(CH_3)_3$] | 0.2 parts by weight |
| *ISOPAR G (manufactured by Esso Chemicals Ltd.) | 120 parts by weight |

A polyethylene terephthalate film having a thickness of 12 μm was laminated on the surface of the silicone rubber layer thus obtained, and waterless planographic printing plate precursors of Examples 1 to 8 and Comparative Examples of 1 to 4 were thus obtained.

Measurements of Sensitivity

After the cover film of each of the resulting waterless planographic printing plate precursors had been peeled off, a writing process for writing a continuous line was carried out thereon by using a semiconductor laser with a wavelength of 830 nm, a beam diameter of 32 $\mu$m ($1/e^2$) and an output of 300 mW, while varying the writing speed. Thereafter, the plate surface was rubbed with a developing pad containing isopropanol so that the silicone rubber layer at the laser irradiated portions were removed. The plate surface energy, which would allow the silicone rubber layer at the irradiated portions to be peeled off as a continuous line, was determined, and defined as the sensitivity. The results of the measurements are also listed in Table 5.

Measurements of Nitrogen Oxides

With respect to the generation of nitrogen oxides, the same laser as described above was used, and when exposure was carried out with a plate-surface energy of 300 mJ/cm$^2$, the generated amount of NO and $NO_x$ (mg) per laser exposure area of 500 cm$^2$ was measured by using a gas detector tube (Detector tube No. 10 manufactured by Gas Tech (K.K.)). The results of the measurements are also shown in Table 5.

The results of Table 5 show that the waterless planographic printing plate precursor of the present invention, which uses a light-to-heat conversion layer containing polyurethane having at least one carboxyl group, has high sensitivity without generating toxic gases such as nitrogen oxides at the time of a heat-mode recording process using laser light. In contrast, other planographic printing plate precursors of Comparative Examples 1 and 2, which use a light-to-heat conversion layer containing nitrocellulose, have good sensitivity, but generate toxic nitrogen oxides at the time of a writing process. The other planographic printing plate precursors of Comparative Examples 3 and 4, which use a generally-used polymer not containing nitrocellulose, have inferior sensitivity which raises problems in practical use.

As described above, the waterless planographic printing plate precursor of the present invention has high sensitivity without generating toxic gases such as nitrogen oxides at the time of image-recording using heat-mode laser light. Moreover, it is possible to easily form the waterless planographic printing plate by exposing and developing the waterless planographic printing plate precursor.

What is claimed is:

1. A waterless planographic printing plate precursor comprising:

a support member;

a light-to-heat conversion layer for converting laser light to heat; and a silicone rubber layer, wherein the light-to-heat conversion layer contains at least one polyurethane having at least one carboxyl group, and at least one light-to-heat conversion substance.

2. The waterless planographic printing plate precursor according to claim 1, wherein the light-to-heat conversion layer contains no self-oxidizing nitrogen-containing compound.

3. The waterless planographic printing plate precursor according to claim 1, wherein the light-to-heat conversion layer is placed closer to the support member than the silicone rubber layer.

4. The waterless planographic printing plate precursor according to claim 1, wherein the light-to-heat conversion substance is at least one substance selected from the group consisting of infrared-ray absorbing dyes, infrared-ray absorbing pigments, infrared-ray absorbing metals, infrared-ray absorbing metal oxides, and organic and inorganic materials that absorb light having a wavelength used for a writing laser.

5. The waterless planographic printing plate precursor according to claim 1, wherein the polyurethane having at least one carboxyl group is obtained by a reaction between at least one of a diisocyanate compound and at least one of a diol compound having at least one carboxyl group.

6. The waterless planographic printing plate precursor according to claim 5, wherein the diol compound having at least one carboxyl group is a compound obtained by subjecting tetracarboxylic dianhydride to a ring-opening reaction by using a diol compound.

7. The waterless planographic printing plate precursor according to claim 5, wherein the diol compound having at least one carboxyl group is at least one selected from the group consisting of diol compounds represented by the following general formulas (2), (3) and (4):

Formula (2)

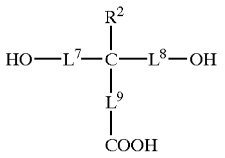

Formula (3)

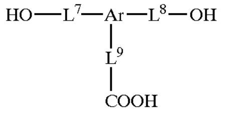

Formula (4)

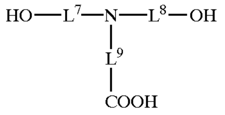

wherein $R^2$ represents a hydrogen atom or an alkyl, aralkyl, aryl, alkoxy, or aryloxy group which may have a substituent (the substituent is at least one selected from the group consisting of hydrogen atom, cyano group, nitro group, halogen atoms, —$CONH_2$, —$COOR^3$, —$OR^3$, —$NHCONHR^3$, —$NHCOOR^3$, —$NHCOR^3$, and —$OCONHR^3$ (wherein $R^3$ represents an alkyl group having 1 to 10 carbon atoms, or an aralkyl group having 7 to 15 carbon atoms)); each of $L^7$, $L^8$ and $L^9$ may be the same or different, and represents a single bond, or a bivalent aliphatic or aromatic hydrocarbon group which may have a substituent which is at least one selected from the group consisting of an alkyl group, an aralkyl group, an aryl group, an alkoxy group and a halogeno group; optionally, each of $L^7$, $L^8$ and $L^9$ has another functional group that does not react with an isocyanate group which is at least one selected from the group consisting of carbonyl, ester, urethane, amide, ureido, and ether group; among $R^2$, $L^7$, $L^8$ and $L^9$, two or three thereof may be bonded to one another to form a ring; and Ar represents a trivalent aromatic hydrocarbon group that may have one or more substituents.

8. The waterless planographic printing plate precursor according to claim 5, wherein the diisocyanate compound is a compound represented by the following formula (1):

OCN—$L^1$—NCO Formula (1)

wherein $L^1$ represents a bivalent aliphatic or aromatichydrocarbon group that may have at least one substituent, and $L^1$ optionally has another functional group, which does not react with the isocyanate group and which is at least one selected from the group consisting of ester, urethane, amide, and ureido groups.

9. The waterless planographic printing plate precursor according to claim 6, wherein the tetracarboxylic dianhydride is at least one selected from the group consisting of compounds represented by the following formulas (5), (6) and (7):

Formula (5)

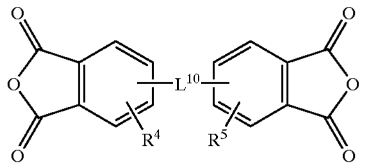

Formula (6)

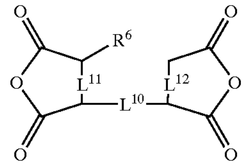

Formula (7)

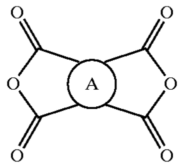

wherein $L^{10}$ represents a single bond, —CO—, —SO—, —$SO_2$—, —O—, —S— or a bivalent aliphatic or aromatic hydrocarbon group which may have a substituent, which is at least one selected from the group consisting of an alkyl, aralkyl, aryl, alkoxy, halogeno, ester and amide group; $R^4$ and $R^5$ may be the same or different, and each represents a hydrogen atom, an alkyl, aralkyl, aryl, alkoxy, or halogeno group; among $L^{10}$, $R^4$ and $R^5$, two thereof may be bonded to form a ring; $R^6$ and $R^7$ may be the same or different, and each represents a hydrogen atom, an alkyl, aralkyl, aryl, or halogeno group; among $L^{10}$, $R^6$ and $R^7$, two thereof may be bonded to form a ring; $L^{11}$ and $L^{12}$ may be the same or different, and each represents a single bond, a double bond, or a bivalent aliphatic hydrocarbon group; and A represents a mononuclear or polynuclear aromatic ring.

10. The waterless planographic printing plate precursor according to claim 1, further comprising:

at least one layer selected from the group consisting of a silicone rubber layer, a surface protective layer, and a primer layer.

11. The waterless planographic printing plate precursor according to claim 5, wherein a diol compound that does not have a carboxyl group is further used in the reaction for forming the polyurethane having at least one carboxyl group.

12. The waterless planographic printing plate precursor according to claim 5, wherein in the polyurethane having at least one carboxyl group, the diol component containing at least one carboxyl group is contained in an amount of 50% to 100% by weight with respect to all weight of the diol components.

13. The waterless planographic printing plate precursor according to claim 1, wherein a content of the polyurethane having at least one carboxyl group is 30 to 90% by weight with respect to the entire solid matter forming the light-to-heat conversion layer.

14. The waterless planographic printing plate precursor according to claim 1, wherein the silicone rubber layer is formed on the light-to-heat conversion layer.

15. The waterless planographic printing plate precursor according to claim 1, wherein the light-to-heat conversion substance is a carbon black.

16. The waterless planographic printing plate precursor according to claim 1, wherein the added amount of the light-to-heat conversion substance is in the range of 5 to 70% by weight with respect to all of the solid material forming the light-to-heat conversion layer.

17. The waterless planographic printing plate precursor according to claim 1, wherein the light-to-heat conversion layer further comprises at least one substance selected from the group consisting of a cross-linking agent, a binder for dissolving or dispersing a light-to-heat conversion material, a pigment dispersing agent, an adhesion enhancing agent and a surface active agent.

18. The waterless planographic printing plate precursor according to claim 1, wherein the light-to-heat conversion layer has a thickness in a range of 0.05 to 10 μm, and the silicone rubber layer has a dried film thickness in a range of 0.5 to 5 $g/m^2$.

19. A method of producing a waterless planographic printing plate precursor comprising the steps of:

providing a light-to-heat conversion layer on a support member, the light-to-heat conversion layer including at least one polyurethane having at least one carboxyl group, and at least one light-to-heat conversion substance; and forming a silicone rubber layer on the light-to-heat conversion layer.

20. The method of producing a waterless planographic printing plate precursor according to claim 19, wherein the light-to-heat conversion layer contains no self-oxidizing nitrogen-containing compound.

21. An image recording process comprising a step of exposing laser on a waterless planographic printing plate precursor comprising:

a support member;

a light-to-heat conversion layer for converting laser light to heat; and a silicone rubber layer, wherein the light-to-heat conversion layer contains at least one polyurethane having at least one carboxyl group, and at least one light-to-heat conversion substance so as to allow the light-to-heat conversion layer at exposed portions to react and to cause a reduction in an adhesive strength between the support member and the light-to-heat conversion layer having the silicone rubber layer thereon.

* * * * *